(12) United States Patent
Kawazoe et al.

(10) Patent No.: US 7,355,213 B2
(45) Date of Patent: Apr. 8, 2008

(54) ELECTRODE MATERIAL AND SEMICONDUCTOR ELEMENT

(75) Inventors: Hiroshi Kawazoe, Yokohama (JP); Hiroaki Yanagita, Hino (JP); Masahiro Orita, Akishima (JP)

(73) Assignee: Hoya Corporation (JP)

( * ) Notice: Subject to any disclaimer, the term of this patent is extended or adjusted under 35 U.S.C. 154(b) by 245 days.

(21) Appl. No.: 10/516,377

(22) PCT Filed: Apr. 23, 2004

(86) PCT No.: PCT/JP2004/005868

§ 371 (c)(1),
(2), (4) Date: Dec. 21, 2004

(87) PCT Pub. No.: WO2004/097849

PCT Pub. Date: Nov. 11, 2004

(65) Prior Publication Data

US 2006/0261487 A1 Nov. 23, 2006

(30) Foreign Application Priority Data

Apr. 25, 2003 (JP) .............................. 2003-122978

(51) Int. Cl.
*H01L 29/24* (2006.01)
(52) U.S. Cl. ..................... 257/103; 257/79; 257/86
(58) Field of Classification Search ................ 257/427, 257/54, 79, 82, 762, 765
See application file for complete search history.

(56) References Cited

U.S. PATENT DOCUMENTS 6,670,649 B2 * 12/2003 Yi et al. .................... 257/109

FOREIGN PATENT DOCUMENTS

| JP | 59-18877 B2 | 5/1984 | |
|---|---|---|---|
| JP | 360260427 A | * 12/1985 | ................. 422/50 |
| JP | 07-29924 A | 1/1995 | |
| JP | 07-221348 A | 8/1995 | |
| JP | 08-023112 A | 1/1996 | |
| JP | 2000-091598 A | 3/2000 | |

OTHER PUBLICATIONS

Grima-Gallardo et al., "A Comparative Study of (Cu-III-Se2)x-(FeSe)1– Alloys (III: Al, Ga, In) ($0 \leq x \leq !$) by X-Ray Diffraction, Differential Thermal Analysis and Scanning Electron Microscopy" Phys. Stat. Sol., 187, No. 2, 395-405, Wiley 2001.*
International Search Report (Publication No. WO 2004/097849), Dated Aug. 17, 2004.
Katayama et al., "ZnSe-based with LEDs", Journal of Crystal Growth, vol. 214/215, pp. 1064-1070, (2000).
Ishibashi, et al., "Advances in blue laser diodes", Journal of Crystal Growth, vol. 138, pp. 677-685, (1994).
Fan, et al., "Graded band gap ohmic contact to p-ZnSe", Appl. Phys. Lett., vol. 61, pp. 3160-3162, (Dec. 1992).
M. Konagai, "Basis and application of thin film solar cell," OHMSHA, pp. 175-192 (2001).

* cited by examiner

*Primary Examiner*—M. Wilczewski
*Assistant Examiner*—Paul E Patton
(74) *Attorney, Agent, or Firm*—Cook, Alex, McFarron, Manzo, Cummings & Mehler, Ltd.

(57) ABSTRACT

As a p-type ohmic contact electrode formation technique in a Group II-VI compound semiconductor, there is provided a material for forming an electrode that is low in resistance, stable, and not toxic, and is excellent in productivity, thereby providing an excellent semiconductor element. A semiconductor electrode material in the form of a material represented by a composition formula AxByCz where A: at least one element selected from Group 1B metal elements, B: at least one element selected from Group 8 metal elements, C: at least one element selected from S and Se), where X, Y, and Z are such that $X+Y+Z=1$, $0.20 \sim X \sim 0.35$, $0.17 \sim Y \sim 0.30$, and $0.45 \sim Z \sim 0.55$.

11 Claims, 9 Drawing Sheets

FIG.17 [TABLE 1]

(COMPOSITION IS EXPRESSED IN ATOM%)

| | EXAMPLE 1 | EXAMPLE 2 | EXAMPLE 3 | EXAMPLE 4 | EXAMPLE 5 | EXAMPLE 6 | EXAMPLE 7 | EXAMPLE 8 | EXAMPLE 9 | EXAMPLE 10 | EXAMPLE 11 | EXAMPLE 12 | EXAMPLE 13 | EXAMPLE 14 | EXAMPLE 15 |
|---|---|---|---|---|---|---|---|---|---|---|---|---|---|---|---|
| Cu | 24.5 | 27.5 | 30.0 | 23.8 | 26.5 | 22.5 | 32.5 | 32.5 | 25.0 | 20.0 | 22.5 | 21.0 | 27.5 | 28.8 | 25.0 |
| Fe | 24.5 | 22.5 | 20.0 | 23.8 | 21.0 | 22.5 | 17.5 | 20.0 | 25.0 | 30.0 | 27.5 | 26.5 | 18.8 | 25.0 | 28.8 |
| S | 51.0 | 50.0 | 50.0 | 52.5 | 52.5 | 55.0 | 50.0 | 47.5 | 10.0 | 50.0 | 50.0 | 52.5 | 53.7 | 46.2 | 46.2 |
| Se | | | | | | | | | 40.0 | | | | | | |
| [TOTAL] | 100.0 | 100.0 | 100.0 | 100.1 | 100.0 | 100.0 | 100.0 | 100.0 | 100.0 | 100.0 | 100.0 | 100.0 | 100.0 | 100.0 | 100.0 |
| RESISTIVITY (×10⁻³ Ωcm) | 200 | 32 | 5.5 | 55 | 10 | 3.7 | 9 | 23 | 50 | 41 | 85 | 31 | 7 | 30 | 45 |

FIG.18 [TABLE 2]

| | EXAMPLE 16 | EXAMPLE 17 | EXAMPLE 18 |
|---|---|---|---|
| Cu | 22.0 | 27.5 | 27.5 |
| Ag | 5.5 | | |
| (GROUP 1B ELEMENT TOTAL AMOUNT) | 27.5 | 27.5 | 27.5 |
| Fe | 22.5 | 20.0 | 20.5 |
| Co | | 2.5 | |
| Ni | | | 2.0 |
| (GROUP 8 ELEMENT TOTAL AMOUNT) | 22.5 | 22.5 | 22.5 |
| S | 50.0 | 50.0 | 50.0 |
| Se | | | |
| [TOTAL] | 100.0 | 100.0 | 100.0 |
| RESISTIVITY (×10⁻³ Ωcm) | 52 | 43 | 48 |

FIG.19 [TABLE 3]

| | REFERENCE EXAMPLE 1 | REFERENCE EXAMPLE 2 | REFERENCE EXAMPLE 3 |
|---|---|---|---|
| Cu | 40.0 | 20.0 | 20.0 |
| Fe | 15.0 | 20.0 | 35.0 |
| S | 45.0 | 60.0 | 45.0 |
| [TOTAL] | 100.0 | 100.0 | 100.0 |
| RESISTIVITY (×10⁻³ Ωcm) | 3000 | 1500 | 2010 |

ELECTRODE MATERIAL AND SEMICONDUCTOR ELEMENT

TECHNICAL FIELD

The present invention relates to an ohmic contact between a low-resistance hole-injection electrode material and a p-type Group II-VI compound semiconductor, and a semiconductor element and a semiconductor light-emitting element that use such an ohmic contact. Further, the present invention relates to a hole-injection electrode material effective for a Group II-VI compound semiconductor, a Group III-V compound semiconductor, and an organic semiconductor, and a semiconductor element and a semiconductor light-emitting element that use such a hole-injection electrode material.

BACKGROUND ART

<Hole-Injection Electrode Formation Technique for Group II-VI Compound Semiconductor>

As described in Unexamined Patent Publication No. Hei 07-029924, the following three points are generally known as conventional p-type semiconductor ohmic contact electrode formation techniques:

1) to use an electrode metal having a work function greater than an Fermi level position of a semiconductor, 2) to form a low-resistance p+ layer doped to a high concentration, i.e. a so-called contact layer, between a semiconductor and an electrode, and 3) to use an alloy reaction between an electrode metal and a semiconductor.

With respect to Group II-VI compound semiconductors represented by ZnSe, except minor examples of MgTe, ZnTe, and so forth, there exists no metal having a sufficiently large work function as its p-type electrode. Therefore, for ohmic contact formation between a p-type semiconductor and an electrode, there have been various improvements in using a contact layer. As described in Journal of Crystal Growth, vol. 214/215 (2000), pp. 1064-1070/K. Katayama et al., it is the present state that use is mainly made of two techniques, i.e. forming a ZnTe/ZnSe inclined structure or forming ZnTe/ZnSe MQW (multiple quantum well) structure, and arranging a metal (electrode metal) such as AU thereon. This is because, since p-ZnTe is capable of doping up to a hole concentration of $10^{19}$ cm$^{-3}$ (Journal of Crystal Growth, vol. 138 (1994), pp. 677-685/A. Ishibashi et al., Applied Physics Letters, vol. 61 (1992), pp. 3160-3162/Y. Fan et al.) so as to be easily reduced in resistance, it is possible to form an ohmic contact using Au or the like.

As described in Journal of Crystal Growth, vol. 138 (1994), pp. 677-685/A. Ishibashi et al., Applied Physics Letters, vol. 61 (1992), pp. 3160-3162/Y. Fan et al., these techniques have a problem that since films of ZnSe and ZnTe are stacked in multilayers in unit of angstrom, a complicated and precise film thickness control is required to thereby cause a limit to the productivity.

Further, an electrode using p-ZnTe is not necessarily stable. As described in Journal of Crystal Growth, vol. 214/215 (2000), pp. 1064-1070/K. Katayama et al., it is known that a contact resistance increases due to long-term operation of a semiconductor element to finally cause breakage thereof. It is considered that this is because crystal defect occurs at a ZnTe/ZnSe interface due to Joule heat generation caused by the contact resistance present from the beginning.

Further, since ZnTe is a substance having toxicity, industrial use thereof in large quantities is not desirable.

It is the present state that electrodes by the use of other techniques have not been put to practical use due to a problem of difficulty in achieving sufficient reduction in resistance or of being poor in stable reproducibility.

There is disclosed a technique other than the above of doping a large amount of nitrogen N to form a so-called p+ layer as a contact layer (Unexamined Patent Publication No. Hei 07-029924). However, it is known that the acceptor concentration upper limit of the typical Group II-VI compound semiconductor ZnSe by the use of N is $10^{18}$ cm.$^{-3}$ (Journal of Crystal Growth, vol. 138 (1994), pp. 677-685/A. Ishibashi et al.) so that the function as a sufficiently low-resistance contact layer is still insufficient.

Unexamined Patent Publication No. Hei 07-221348 discloses an electrode having a p-type chalcopyrite layer as a contact layer on a p-type Group II-VI compound semiconductor, and a metal layer on the p-type chalcopyrite layer. This technique has a structure similar to a semiconductor element of the present invention. However, the disclosed resistivity of the chalcopyrite layer is rather high as about $10^{-2}$ Ωcm. This is because, as a substance having a chalcopyrite structure, selection is made of copper indium selenide (CuInSe$_2$), copper indium sulfide (CuInS$_2$), or mixed crystals thereof. There is a problem that when the resistance of the chalcopyrite layer serving for carrier injection is high, a current rise voltage in a diode characteristic increases so that a calorific value during operation increases to cause deterioration of the element.

Further, apart from the above, Examined Patent Publication No. Sho 59-18877, for example, discloses a technique of contacting a p-type chalcopyrite compound semiconductor with an n-type Group II-VI compound semiconductor to form a pn junction as a method of injecting holes into the n-type Group II-VI compound semiconductor. This is the technique developed in terms of a background that the Group II-VI compound semiconductor can be relatively easily formed into a low-resistance n-type, while reduction in resistance in p-type is technically difficult. Examined Patent Publication No. Sho 59-18877 discloses a technique of contacting a chalcopyrite compound semiconductor Cu$_{1-y}$Ag$_y$Ga$_{1-z}$Al$_z$S$_2$, which can be easily formed into a p-type, with ZnS$_{1-x}$Se$_x$. This relates to a technique about a so-called heterojunction that uses the chalcopyrite compound as a p-region of the semiconductor pn-junction and the Group II-VI compound semiconductor as an n-region. It is the present state that this technique is not put to practical use because the crystal synthesizing technique for the junction formation is difficult and because the technique itself of forming the Group II-VI compound semiconductor into a low-resistance p-type has advanced.

As described in "Basis and Application of Thin Film Solar Cell" edited by Makoto Konagai, Ohmsha (2001), pp. 175-192, the chalcopyrite compound has been being actively studied and developed as a material of an active part of a solar cell. The chalcopyrite compound used as the solar cell active part material does not contain a Group 8 element, but uses a Cu(In,Ga)(S,Se)$_2$-based material having a bandgap of 1 eV or more ("Basis and Application of Thin Film Solar Cell" edited by Makoto Konagai, Ohmsha (2001), pp. 175-192). In the solar cell application, the magnitude of the bandgap is important in terms of matching with the sunlight spectrum. This value is a material physical property that determines the efficiency of the solar cell. Since the Cu(In,Ga)(S,Se)$_2$-based material has an appropriate value, attention is now being paid to the development thereof. The technique of this field is common to the present invention in the point of contacting the chalcopyrite compound with another semiconductor and utilizing an electrical function that can transport electrical carriers. However, the solar cell is a technique of converting light energy into electrical energy, i.e. taking out carriers generated by the light to an electrode, while the present invention is a technique relating to an electrode that injects carriers into a semiconductor material, and therefore, both belong to the definitely different fields. Further, the chalcopyrite compound used as the solar cell active part material is not a substance that contains a Group 8 element. This is because, inclusion of the Group 8 element causes the substance to lose its transparency so that matching with the sunlight spectrum is spoiled and thus it cannot be used for a solar cell.

DISCLOSURE OF THE INVENTION

The p-type ohmic contact electrode formation technique in the Group II-VI compound semiconductor is the technique that requires the complicated and delicate operation for the manufacture, the technique that uses the material having the toxicity, or the technique that is poor in reproducibility, and therefore, there has been a problem in terms of productivity and long-term stability. In view of this, there is required a technique for forming an electrode that is low in resistance, stable, and not toxic, and is excellent in productivity.

The subject of the present invention is to provide, as a p-type ohmic contact electrode formation technique in a Group II-VI compound semiconductor, a material for forming an electrode that is low in resistance, stable, and not toxic, and is excellent in productivity, and to provide an excellent semiconductor element.

Further, it is an object of the present invention to provide an electrode material applicable not only to a Group II-VI compound semiconductor but also to various materials (e.g. Group III-V compound semiconductor and organic semiconductor), and to provide an excellent semiconductor element.

In order to solve the foregoing problems and accomplish the desired objects, the present invention is configured as follows. Note that assigned numerals coincide with those in FIG. 1.

(1) It is configured to be an electrode material (semiconductor electrode material) represented by a composition formula $A_X B_Y C_Z$ (A: at least one element selected from Group 1B metal elements, B: at least one element selected from Group 8 metal elements, C: at least one element selected from S and Se), where X, Y, and Z are such that X+Y+Z=1, $0.20 \leqq X \leqq 0.35$, $0.17 \leqq Y \leqq 0.30$, and $0.45 \leqq Z \leqq 0.55$.

Herein, A, B, and C are each not necessarily limited to only one element but can include a plurality of elements such that A simultaneously contains Cu and Ag, B simultaneously contains Fe and Ni, and C simultaneously contains S and Se.

Further, "an electrode material in the form of a material represented by a composition formula $A_X B_Y C_Z$" according to the invention of the present application may be "an electrode material containing, by 100%, a material represented by a composition formula $A_X B_Y C_Z$" or "an electrode material containing, as a main component, a material represented by a composition formula $A_X B_Y C_Z$ and also containing another component or element". Specific examples thereof will be described later.

(2) It is configured to be the electrode material of (1) wherein A comprises Cu and B comprises Fe.

A sulfide, a selenide, or a selenide sulfide containing Cu and Fe is capable of particularly reduction in resistance and therefore can obtain an excellent characteristic as an electrode material.

(3) It is configured to be an electrode material characterized in that the electrode material described in (1) or (2) has a chalcopyrite structure.

The present inventors have found that the electrode material of the present invention is a material that does not rely on a crystal structure of a material serving as an underlying layer of the electrode material and can form the chalcopyrite structure. Specifically, it is possible to adopt, as a substrate, not only a single crystal substrate but also a polycrystalline substrate, a glass substrate, a plastic substrate, or the like. Conventionally, epitaxial growth was essential for obtaining a practical electrical characteristic so that it was necessary to use a predetermined single crystal substrate. Conversely, the electrode material of the present invention has a quite high degree of freedom for substrate selection.

Since it can be formed on the glass substrate or the plastic substrate, a large-area device can be realized using a large-size substrate (e.g. 1 m square). Further, when manufacturing a small-area device, the number of process steps can be reduced by using a large-area substrate, and it is also effective in view of cost.

(4) It is configured to be a semiconductor element characterized in that the electrode material of any of (1) to (3) is placed in contact with a Group II-VI compound semiconductor.

That is, it is configured to be a semiconductor element characterized by having a structure wherein a Group II-VI compound semiconductor and the electrode material of any of (1) to (3) are in contact with each other.

The electrode material of the present invention is preferably used while being in contact with the Group II-VI compound semiconductor, but their vertical positional relationship is not questioned. That is, use may be made by stacking the electrode material on the Group II-VI compound semiconductor or use may be made by stacking the Group II-VI compound semiconductor on the electrode material. As described above, the electrode material of the present invention can take the chalcopyrite structure without relying on the crystal structure of the material of the underlying layer so that the glass substrate, the plastic substrate, or the like can be used as the substrate, and therefore, it is an extremely useful electrode material.

It was found that the Group II-VI compound semiconductor of the present invention may be a p-type semiconductor containing dopants or an ambipolar semiconductor. The ambipolar semiconductor is a semiconductor simultaneously having an electron transport property and a hole transport property. Electrons and holes injected into the ambipolar semiconductor are recombined together in the ambipolar semiconductor and normally emit light corresponding to an energy difference between light-emission levels. The non-doped ambipolar semiconductor is preferable because, since it has no strain or defect, there is no quenching center at a light-emitting portion so that it is possible to suppress reduction in light-emitting efficiency such as it is possible to suppress occurrence of light emission of undesired wavelengths.

(5) It is configured to be a semiconductor element characterized in that an electrode material (10) of any of (1) to (3) is placed on a compound semiconductor (100) at least the surface of which is formed by a p-type II-VI compound.

That is, it is configured to be a semiconductor element characterized by comprising a semiconductor having a Group II-VI compound semiconductor layer at least an outermost surface layer, and the electrode material of any of (1) to (3) which is in contact with the semiconductor via the Group II-VI compound semiconductor layer.

Since the compound $A_XB_YC_Z$ is low in resistance, it is possible to carry out wiring by directly contacting a conventionally used wiring material (e.g. Au, ITO, or the like) with the compound $A_XB_YC_Z$. Further, it is possible to stack an electrode metal (12) on the compound $A_XB_YC_Z$ and to use it as a contact portion with the wiring material. In this case, selection of a proper electrode metal material makes it possible to achieve an effect of increasing tightness between the wiring and the electrode portion to improve reliability of this portion.

(6) In the semiconductor element of (4), it is configured to be a semiconductor element having a layered structure wherein a hole-injection electrode portion of a p-type Group II-VI compound semiconductor (200) is made of a solid solution material (20) of a compound $A_XB_YC_Z$ and the Group II-VI compound semiconductor.

Herein, the compound $A_XB_YC_Z$ is the electrode material of any of (1) to (3).

That is, it is configured to be a semiconductor element characterized by comprising a semiconductor having a Group II-VI compound semiconductor layer at least an outermost surface layer, and a hole-injection electrode portion placed in contact with the semiconductor via the Group II-VI compound semiconductor layer and made of a solid solution material of a compound $A_XB_YC_Z$ in the form of the electrode material described in any of (1) to (3) and a Group II-VI compound semiconductor.

Herein, the Group II-VI compound semiconductor layer located at the outermost surface layer of the semiconductor and the Group II-VI compound semiconductor contained in the hole-injection electrode portion may be the same material (the same element, composition, structure, or the like) or a different material (different element, composition, structure, or the like).

(7) In the semiconductor element of (6), it is configured to be a semiconductor element characterized in that components of the compound $A_XB_YC_Z$ in the hole-injection electrode portion made of the solid solution material of the compound $A_XB_YC_Z$ and the Group II-VI compound semiconductor decrease continuously or stepwise from the surface toward the p-type Group II-VI compound semiconductor.

Herein, the compound $A_XB_YC_Z$ is the electrode material of any of (1) to (3).

That is, in the semiconductor element of (6), it is configured to be a semiconductor element characterized in that components of the compound $A_XB_YC_Z$ in the hole-injection electrode portion decrease continuously or stepwise from the surface toward the Group II-VI compound semiconductor layer (toward a contact portion with the semiconductor layer in a film thickness direction of the hole-injection electrode portion).

(8) In the semiconductor element of (4) to (7), it is configured to be a semiconductor element characterized in that the Group II-VI compound semiconductor contains at least Zn as a Group II element and at least one element selected from S and Se as a Group VI element.

(9) It is configured to be a semiconductor element characterized by having a structure wherein a Group III-V compound semiconductor and the electrode material described in any of (1) to (3) are in contact with each other.

(10) It is configured to be a semiconductor element characterized by having a structure wherein an organic semiconductor and the electrode material described in any of (1) to (3) are in contact with each other.

That is, it was found that the electrode material of the present invention is effective as the hole-injection electrode not only for the Group II-VI compound semiconductor but also for the Group III-V compound semiconductor or the organic semiconductor.

(11) In the semiconductor element of (4) to (10), it is configured to be a semiconductor element characterized in that the semiconductor element is a semiconductor light-emitting element.

It is known that a chalcopyrite compound can easily achieve a low-resistance p-type semiconductor. Further, it is known that a Group II-VI compound semiconductor takes a zincblende structure, while the chalcopyrite compound takes a structure quite similar to the zincblende structure. Specifically, the chalcopyrite structure is a structure having the same atomic arrangement as that of the zincblende structure, wherein unit cells are slightly distorted and stacked in two layers in a z-axis direction.

Because of this structural similarity, the chalcopyrite compound can form mixed crystals (one form of solid solution) between itself and the Group II-VI compound semiconductor. That is, when forming a contact with the Group II-VI compound semiconductor, the chalcopyrite compound can form an atomic level inclined structure with no occurrence of strain or defect at a contact portion therebetween.

It is an essential feature of the present invention to obtain a low-resistance ohmic electrode of a p-type Group II-VI compound semiconductor that is new and excellent in practicality, by paying attention to a point that the chalcopyrite compound is capable of structurally and electrically smooth contact with the Group II-VI compound semiconductor, and a point that the chalcopyrite compound is easily controllable to a low-resistance p-type semiconductor, and further by selecting a substance, among chalcopyrite compounds, that can achieve a low resistivity, and using the selected one.

There are known many compounds having the chalcopyrite structure but, in the present invention, selection is made of a substance composed of a Group 1B element, a Group 8 element, and a chalcogen element. This is because such a substance can easily form an excellent p-type low-resistance semiconductor. It is difficult for other substances to achieve sufficient reduction in resistance so that it is difficult to obtain a property complying with the object of the present invention.

Among the chalcopyrite compounds, $Cu(In,Ga)Se_2$ has been actively studied and developed as a solar cell material and is currently one of typical chalcopyrite compounds in terms of industrial use. However, its resistivity is reportedly limited to $10^{-2}\Omega cm$ ("Basis and Application of Thin Film Solar Cell" edited by Makoto Konagai, Ohmsha (2001), pp. 175-192). As compared with this, a compound composed of a Group 1B element, a Group 8 element, and S and/or Se can achieve a lower resistivity. Particularly, a $CuFeS_2$-based or $CuFeSe_2$-based material comprising Cu as a Group 1B element and Fe as a Group 8 element can achieve a low resistivity of $10^{-3}$ to $10^{-4}\Omega cm$ in the form of a thin film, and therefore, is preferable as an electrode material that is required a low resistance. Since the $Cu(In,Ga)Se_2$-based material is rather high in resistivity as described above, if it is used as an electrode material, the resistance increases to raise a problem of Joule heat generation and so forth.

The content ratio of components of a semiconductor electrode material made of a compound $A_XB_YC_Z$ is preferably $0.20 \leq X \leq 0.35$, $0.17 \leq Y \leq 0.30$, and $0.45 \leq Z \leq 0.55$ (where $X+Y+Z=1$).

If the component ratio exceeds this range, there arises a problem that the compound has a high resistance and does not comply with the object of the present invention or that phases having structures other than the chalcopyrite structure (e.g. pyrite $FeS_2$, bornite $Cu_5FeS_4$, etc.) are generated in large quantities so that an ohmic contact is reluctant to be formed between the compound and the Group II-VI compound semiconductor.

In view of radii of the elements and the numbers of charges obtainable, an alkali element, an alkali earth element, or an element such as Zn, Cd, Al, Ga, In, Ge, Sn, As, or Sb, may be introduced into the compound $A_XB_YC_Z$ within the range that does not decisively spoil the foregoing properties of this material, up to about 10 mol % as a limit.

It is necessary that the Group II-VI compound semiconductor have the zincblende structure which easily forms a solid solution with the electrode material of the present invention. In view of this, it is desirably a compound composed of Zn as a Group II element and an element selected from S and Se as a Group VI element, or mixed crystals of those compounds such as $ZnS_XSe_{(1-X)}$. Further, Mg or Cd may be slightly contained within the range that can keep the zincblende structure as a crystal structure. The Group II-VI compound semiconductor that serves to form a contact is contactable even when its outermost surface is in the state of an intrinsic semiconductor, but it is more preferable that at least the surface thereof be p-type. This is because the p-type layer on the outermost surface functions as a conventionally known so-called contact layer to more facilitate ohmic contact formation.

As described above, although it is possible to obtain the ohmic contact by directly stacking the $A_XB_YC_Z$ on the p-type Group II-VI compound semiconductor, a contact relative to the p-type Group II-VI compound semiconductor may be configured as follows.

(1) A solid solution material composed of the Group II-VI compound semiconductor and the $A_XB_YC_Z$ is placed in contact with the Group II-VI compound semiconductor.

Since the $A_XB_YC_Z$ and the Group II-VI compound semiconductor can form the solid solution due to their structural similarity, such a structure is made possible.

(2) There is disposed a solid solution material composed of the Group II-VI compound semiconductor and the $A_XB_YC_Z$, wherein components of the Group II-VI compound semiconductor continuously increase from the surface toward the Group II-VI compound semiconductor.

As described above, the composition of the solid solution composed of the Group II-VI compound semiconductor and the $A_XB_YC_Z$ can be continuously changed due to their structural similarity, and therefore, such a structure is made possible.

(3) There is disposed a solid solution material composed of the Group II-VI compound semiconductor and the $A_XB_YC_Z$ and having a layered structure wherein components of the Group II-VI compound semiconductor gradually increase stepwise from the surface toward the Group II-VI compound semiconductor.

As described above, the composition of the solid solution composed of the Group II-VI compound semiconductor and the $A_XB_YC_Z$ can be continuously changed due to their structural similarity, and therefore, such a structure is made possible.

As described above, the present invention provides, as the p-type ohmic contact electrode formation technique in the Group II-VI compound semiconductor, the technique of forming the electrode that is low in resistance, stable, and not toxic, and is excellent in productivity. On the other hand, the present inventors have found that, with respect to a semiconductor light-emitting element, the present invention is applicable not only to a case where a light-emitting layer is a p-type semiconductor but also to a case where a light-emitting layer is a semiconductor exhibiting ambipolarity. Further, the present inventors have found that the electrode material of the present invention is also applicable to a case where a light-emitting element is a Group III-V compound semiconductor or an organic semiconductor. The electrode of the present invention can be used as an electrode of the light-emitting element of this structure.

BRIEF DESCRIPTION OF THE DRAWINGS

FIG. 17 is a diagram in the form of Table 1 showing compositions and measured resistivity data according to Examples 1 to 15.

FIG. 18 is a diagram in the form of Table 2 showing compositions and measured resistivity data according to Examples 16 to 18.

FIG. 19 is a diagram in the form of Table 3 showing compositions and measured resistivity data according to Reference Examples 1 to 3.

EFFECT OF THE INVENTION

Figure 1A:
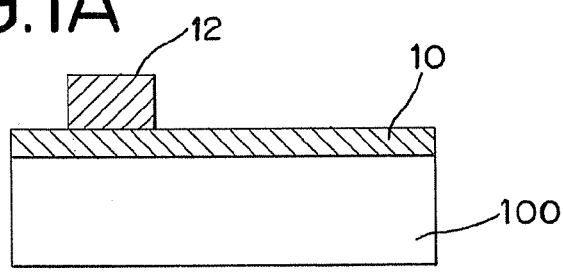
FIG. 1 is a conceptual diagram of structures of semiconductor elements according to the present invention.
Figure 1B:
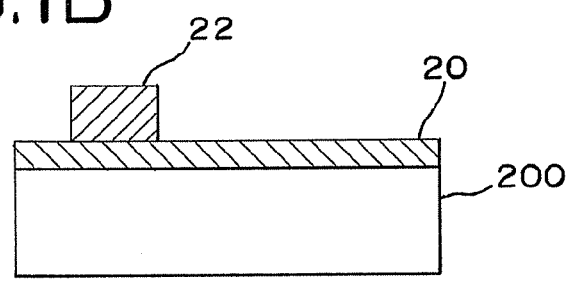
Figure 1C:
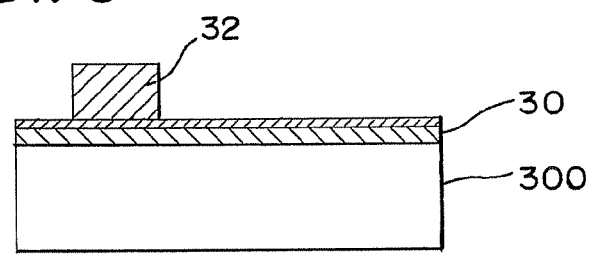
Figure 1D:
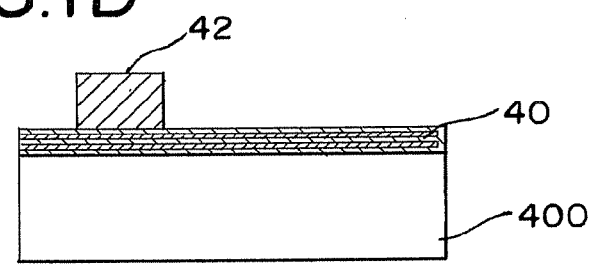

According to the present invention, as a p-type ohmic contact electrode formation technique in a Group II-VI compound semiconductor, there is provided a technique of forming an electrode that is low in resistance, stable, and not toxic, and is excellent in productivity, so that a low threshold value, a long-life element, and so forth can be realized in a Group II-VI compound semiconductor element.

Further, according to the present invention, there is provided an electrode material that is effective not only for a Group II-VI compound semiconductor but also for a Group III-V compound semiconductor or an organic semiconductor. This electrode material is capable of obtaining a practical electrical property with respect to not only a single crystal substrate but also a polycrystalline substrate, a glass substrate, a plastic substrate, or the like.

BEST MODE FOR CARRYING OUT THE INVENTION

Hereinbelow, the embodiment of the present invention will be described in further detail by the use of examples.

EXAMPLE 1

<Electrode Material Synthesis>

Powder feed materials of Cu (purity 99.99%), Fe (purity 99.99%), and S (purity 99.9999%) were weighed and mixed together so as to be 2.0 g in total at 0.245:0.245:0.51 (mole ratio) and enclosed in a quartz glass tube under vacuum at $10^{-3}$ Torr. Heat treatments of 450° C.—10 hours and 975° C.—24 hours were carried out. The temperature raising speed and the temperature dropping speed were both set to 2 degrees/minute. An obtained material was ground into fine grains and subjected to an XRD (X-ray diffraction) analysis, then identified as having a chalcopyrite structure.

The material was press-formed into a pellet having a diameter of 12 mm and a thickness of 1.5 mm by a hydraulic press (pressure 500 kgf/cm$^2$). The porosity in this event was about 10%. A Seebeck effect electromotive force was measured using this pellet for confirming a conduction type, then a negative electromotive force (−0.41 mV) was obtained relative to a positive temperature difference (8 degrees) so that it was found to be a p-type conductor. Similarly using this pellet, the electrical resistivity was measured by a four probe method, then it was 0.2Ωcm and thus it was confirmed that the pellet has an excellent conductivity.

<Formation of Film and Property of the Film>

Using the foregoing press-formed pellet as a feed material, an insulating ZnSe substrate ((100) crystal plane orientation) was subjected to heat deposition film formation by the use of a Mo boat. The substrate temperature was set to 150° C. It was found that an obtained film having a thickness of 1.0 μm exhibited p-type conduction and had a very high conduction property of a carrier concentration of $2 \times 10^{21}$ cm$^{-3}$ and an electrical resistivity of $6 \times 10^{-4}$ Ωcm. It is considered that the resistivity became much smaller than that of the feed material pellet because close intergrain contact was obtained by the film formation.

An XRD analysis was performed, then this thin film had a chalcopyrite structure. Further, the composition of the film was confirmed by an ICP analysis, then it was found to be $Cu_{0.246}Fe_{0.242}S_{0.512}$ and thus substantially the same as that of the feed material.

Figure 2:
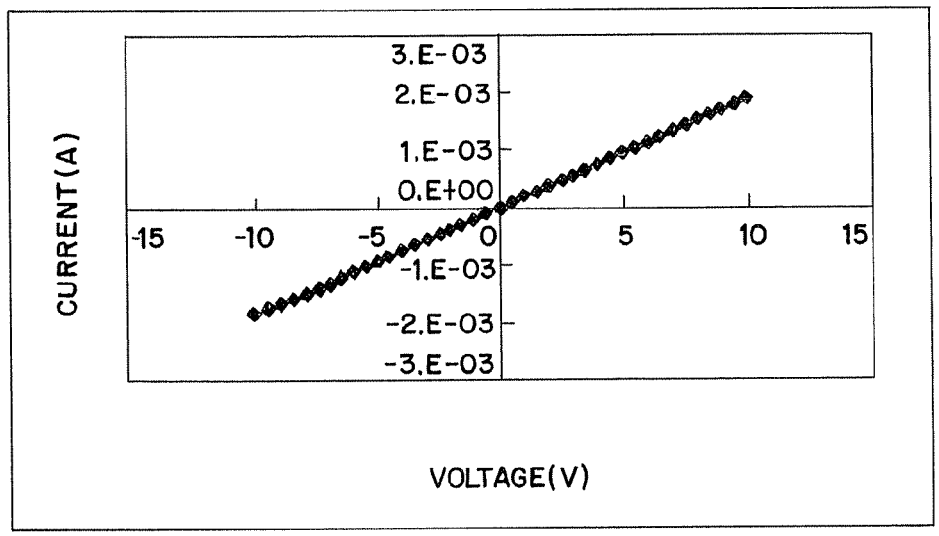
FIG. 2 is a diagram showing one example of a current-voltage characteristic of a Cu—Fe—S film according to the present invention, as described in Example 1.

On this film, Al electrodes of a diameter 1 mm—an interval 3 mm were formed by a deposition process. As a current-voltage characteristic shown in FIG. 2, it was found that there was formed a quite excellent low-resistance contact between these electrodes.

Herein, Al was used as the electrode metal. However, since this thin film has a high carrier concentration and a high conductivity, there is no limit to an electrode metal so that a similar current-voltage characteristic can be obtained by the use of another metal such as Au, In, Pt, or Pd.

EXAMPLES 2 to 18

With compositions shown in Table 1 (FIG. 17) and Table 2 (FIG. 18), syntheses were carried out like in Example 1. The purities of used Se, Ag, Co, and Ni were 99.99%. The resistivity was measured like in Example 1, then it was found that all of them were excellent low-resistance conductors as shown in Table 1 (FIG. 17) and Table 2 (FIG. 18). An XRD analysis was carried out, then it was found that phases (pyrite FeS2, bornite Cu5FeS4, etc.) other than chalcopyrite were observed in part of the compositions, but amounts thereof were as small as 5% or less, and thus, substances of substantially the chalcopyrite structure were synthesized.

Figure 8:
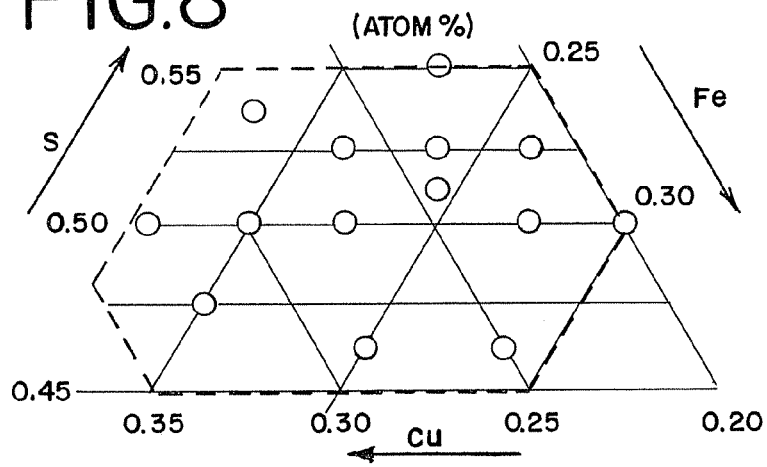
FIG. 8 is a diagram relating to Examples 1 to 8 and Examples 10 to 15, wherein compositions thereof are triangular diagram plotted.

Note that FIG. 8 is obtained by triangular diagram plotting the compositions of the examples 1 to 8 and the examples 10 to 15. In the figure, a region surrounded by a dotted line ( - - - ) is a composition region of electrode materials of the present invention in case of compounds $A_XB_YC_Z$ where A is Cu, B is Fe, and C is S.

REFERENCE EXAMPLE 1

Cu, Fe, and S were weighed and mixed together so as to be at 0.40:0.15:0.45 in mole ratio and synthesis was carried out like in Example 1. The resistivity was measured, then a large value of 3Ωcm was exhibited. An XRD analysis was performed, then it was found that the chalcopyrite phase was contained slightly while bornite $Cu_5FeS_6$ was contained in large quantities.

REFERENCE EXAMPLES 2 and 3

With compositions shown in Table 3 (FIG. 19), syntheses were carried out like in Example 1. The resistivity was measured, then large values were exhibited as shown in Table 3 (FIG. 19). An XRD analysis was carried out, then it was found that the chalcopyrite phase was contained slightly and that FeS$_2$ was contained in large quantities in Reference Example 2 while $CuFe_2S_3$ was contained in large quantities in Reference Example 3.

EXAMPLE 16

<Film Formation and Contact Resistance>

Figure 3:
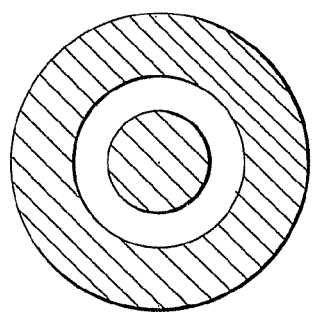
FIG. 3 is a diagram illustrating the shape of circular electrodes of Example 16.

On N-doped p-ZnSe (carrier concentration $2 \times 10^{17}$ cm$^{-3}$) formed into a film on a high-resistance GaAs substrate by an MBE (molecular beam epitaxy) process, deposition was carried out with a substrate temperature at 150° C. to form films into a circular shape (a center electrode with a diameter of 1 mmφ and a peripheral electrode with an outer diameter of 3 mmφ therearound at an interval of 0.2 mm) shown in FIG. 3 by the use of a material synthesized like in Example 1 as a feed material. Al was further deposited thereon to form films having the same shape as above.

Figure 4:
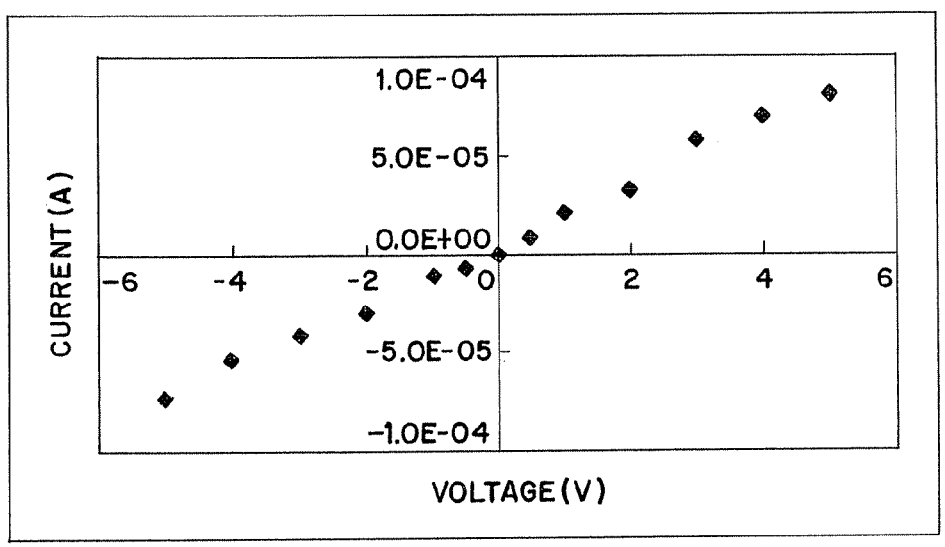
FIG. 4 is a diagram showing a current-voltage characteristic measured using the circular electrodes of Example 16.

FIG. 3 is a diagram showing the shape of circular electrodes of Example 16. An interelectrode current-voltage characteristic measured using such circular electrodes is as shown in FIG. 4, wherein a linear characteristic with no threshold voltage was exhibited.

Further, like in Unexamined Patent Publication No. Hei 6-333958, a transmission line model (TLM) pattern was formed on the foregoing N-doped p-ZnSe like the foregoing using a material synthesized like in Example 1 as a feed material, and Al-deposition film formation was further performed on the pattern in the same shape.

The contact resistance was evaluated using this pattern, then an excellent value of $5 \times 10^{-3} \Omega cm^2$ was exhibited.

In the foregoing example, ZnSe (meaning inclusion of Zn and Se but not defining the content ratio of them, which shall also apply hereinafter) was used as a p-type Group II-VI compound semiconductor. However, a similar effects is achieved when use is made of another compound semiconductor in the same group, for example, ZnSSe, ZnMgSe, or ZnMgSSe.

<Manufacture of Diode>

Figure 5:
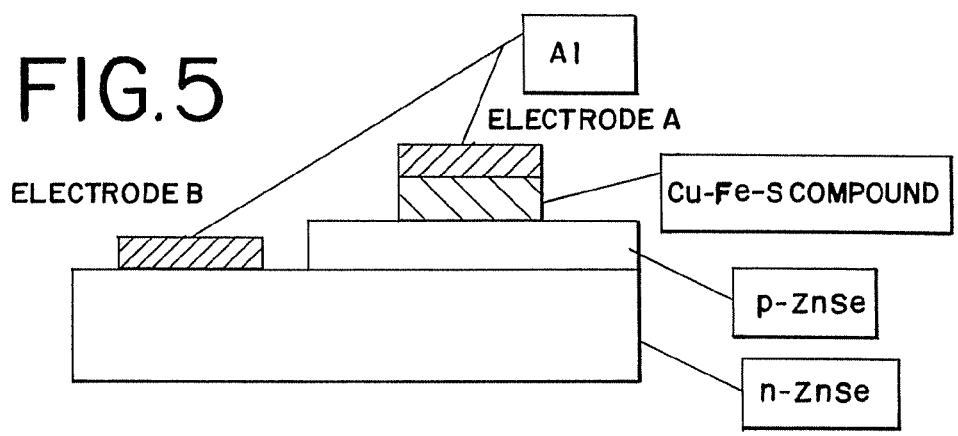
FIG. 5 is a diagram exemplarily illustrating a diode shown in Example 16.

FIG. 5 is a diagram exemplarily illustrating a diode of Example 16. The diode having a structure shown in this figure was manufactured. On an n-type ZnSe single crystal substrate ((100) crystal plane orientation) having a resistivity of $2\Omega cm$, N-doped p-ZnSe (carrier concentration $2 \times 10^{17}$ $cm^{-3}$) was formed into a film by an MBE (molecular beam epitaxy) process like the foregoing. Deposition of a diameter of 1 mm and a thickness of 0.5 μm was further performed thereon using a material synthesized like in Example 1 as a feed material, and an Al film (0.1 μm in thickness) was further deposited thereon into the same shape. This is given as an electrode A. During this Al deposition, an Al-deposited film was directly formed on the n-ZnSe substrate at a position distanced from the electrode A by about 2 mm as shown in the figure. This is given as an electrode B. Thereafter, the substrate and all were subjected to a heat treatment at 350° C. for 2 minutes.

Figure 6:
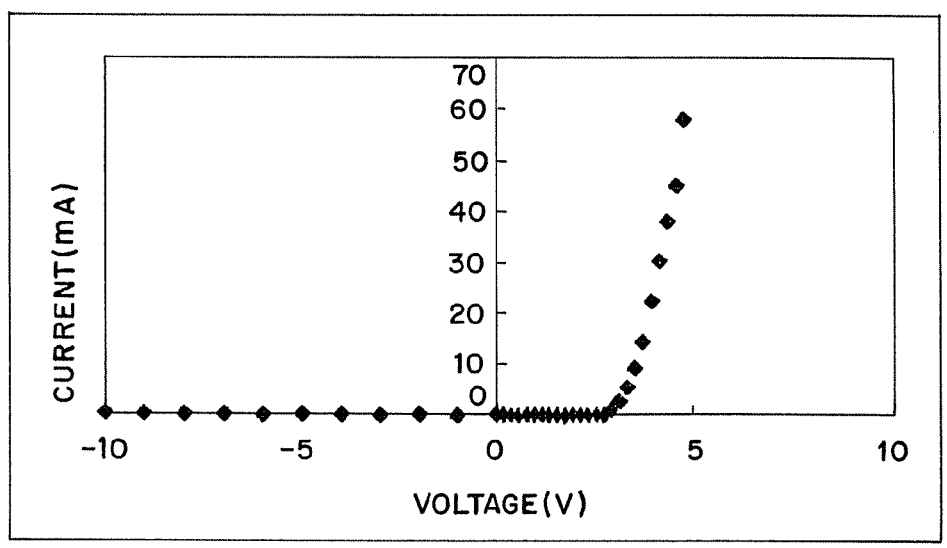
FIG. 6 is a diagram showing a current-voltage characteristic of the diode shown in Example 16.

Using the electrode A as a positive electrode and the electrode B as a negative electrode, a current-voltage characteristic thereof was observed. As shown in FIG. 6, there was obtained a rectification characteristic exhibiting a threshold value around +3V.

With the supply of a voltage equal to or greater than this threshold value, light emission with a peak wavelength of about 465 nm was observed from a p-ZnSe/n-ZnSe interface.

EXAMPLE 17

<Synthesis of $(Cu_{0.245}Fe_{0.245}S_{0.51})_{0.9}$—$(ZnSe)_{0.1}$ Solid Solution and Property thereof>

A Cu—Fe—S compound synthesized like in Example 1 and ZnSe powder (purity 99.999%) were mixed together and ground into fine grains at a mole ratio of 9:1, then press-formed into a pellet like in Example 1. This pellet was enclosed in a quartz glass tube under vacuum at about $10^{-3}$ Torr and was subjected a firing heat treatment at 950° C. for 8 hours. The pellet was taken out and subjected to an XRD analysis, then it was found that a zincblende structure observed in the ZnSe feed material was not observed, but the pellet had a chalcopyrite structure and thus ZnSe was dissolved in $Cu_{0.245}Fe_{0.245}S_{0.51}$.

It was confirmed that the material subjected to the foregoing firing treatment exhibited p-type conduction and had a resistivity of $12\Omega cm$.

<Formation of Film and Property of the Film>

Using the foregoing firing-treated pellet as a feed material, an insulating ZnSe substrate ((100) crystal plane orientation) was subjected to heat deposition film formation by the use of a Mo boat. The substrate temperature was set to 150° C. It was found that an obtained film having a thickness of 1.0 μm exhibited p-type conduction and had a very high conduction property of a resistivity of $3 \times 10^{-3} \Omega cm$. An XRD analysis was performed, then this thin film had a chalcopyrite structure.

On this film, Al electrodes of a diameter 1 mm—an interval 3 mm were formed by a deposition process, and a current-voltage characteristic thereof was observed. There was obtained a linear characteristic with substantially no threshold voltage observed. It was found that there was formed a quite excellent low-resistance ohmic contact between the electrodes.

<Manufacture of Diode>

A diode is manufactured like in Example 16 except that the material synthesized in Example 1 was changed to the foregoing $(Cu_{0.245}Fe_{0.245}S_{0.51})_{0.9}$—$(ZnSe)_{0.1}$ Solid Solution. There was obtained an excellent rectification characteristic like in FIG. 6. With the supply of a voltage equal to or greater than a threshold value, light emission with a peak wavelength of about 465 nm was observed from a p-ZnSe/n-ZnSe interface.

EXAMPLE 18

Figure 7:
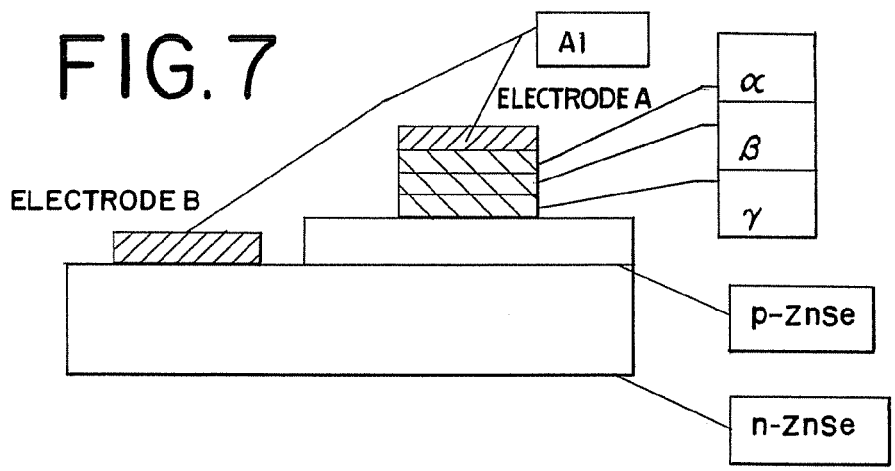
FIG. 7 is a diagram exemplarily illustrating a diode shown in Example 18.

Like in Example 17, materials were synthesized wherein a Cu—Fe—S (notation of "Cu—Fe—S" means substantially consisting of Cu, Fe, and S, but does not define the content ratio of them, which shall also apply hereinafter) compound synthesized like in Example 1 and ZnSe powder (purity 99.999%) were mixed together at mole ratios of 9:1, 5:5, and 1:9, respectively. The respective materials are given as α, β, and γ. Like in Example 16 or 17, a diode was manufactured using these materials. As exemplarily illustrated in FIG. 7, it had a layered structure composed of Al/α/β/γ/p-ZnSe/n-ZnSe. The thickness of each of the α, β, and γ layers was 0.15 μm. There was obtained an excellent rectification characteristic like in FIG. 6. With the supply of a voltage equal to or greater than a threshold value, light emission with a peak wavelength of about 465 nm was observed from a p-ZnSe/n-ZnSe interface.

EXAMPLE 19

α, β, and γ produced in Example 18 were deposited into films (thickness of each layer 0.15 μm) on a high-resistance ZnSe substrate in a structure of α/β/γ/ZnSe, and a heat treatment was applied thereto at 350° C. for 5 minutes. The element concentration distribution of this film was observed by SIMS (secondary ion mass spectrometry), then it was found that α/β/γ interfaces became indefinite and the contents of Zn and Se continuously increased in order of α→β→γ. It was found that the compositions continuously changed like substantially α→β→γ.

A heat treatment at 350° C. for 5 minutes was applied to the diode manufactured in Example 18 and a current-voltage characteristic thereof was observed, then an excellent rectification characteristic like in FIG. 6 was obtained. In Example 18, it was the layered structure in which the α/β/γ component ratio changed stepwise. However, it was found that even in case where substantially continuous composition changes were provided like in this example, the excellent characteristic was obtained.

With the supply of a voltage equal to or greater than a threshold value, light emission with a peak wavelength of about 465 nm was observed from a p-ZnSe/n-ZnSe interface.

EXAMPLE 20

A diode was manufactured like in Example 16 except that non-doped ZnSe was inserted between the n-type ZnSe single crystal substrate and the N-doped p-ZnSe. This means that the non-doped ZnSe was used as an ambipolar semiconductor that forms a light-emitting layer. The ambipolar semiconductor is a semiconductor simultaneously having an electron transport property and a hole transport property. Electrons and holes injected into the ambipolar semiconductor are recombined together in the ambipolar semiconductor and normally emit light corresponding to an energy difference between light-emission levels.

The non-doped ambipolar semiconductor is preferable because, since it has no strain or defect, there is no quenching center at a light-emitting portion so that it is possible to suppress reduction in light-emitting efficiency such as it is possible to suppress occurrence of light emission of undesired wavelengths.

Figure 9:
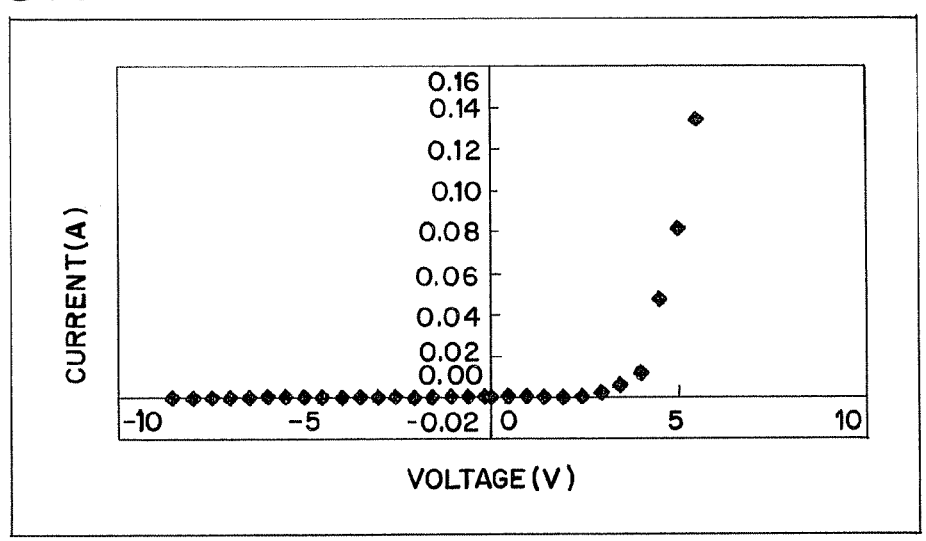
FIG. 9 is a diagram showing a voltage current characteristic of a diode according to Example 20.
Figure 10:
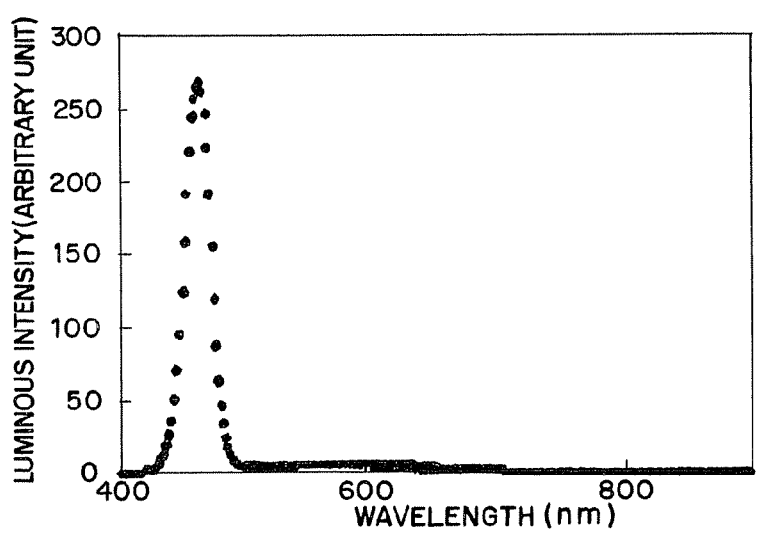
FIG. 10 is a diagram showing an emission spectrum of the diode according to Example 20.

The non-doped ZnSe layer was formed by an MBE process like in Example 16. The thicknesses of the non-doped ZnSe layer and the N-doped p-ZnSe layer were set to 100 nm and 500 nm, respectively. FIG. 9 shows a current-voltage characteristic curve of this diode. An excellent diode characteristic was obtained. FIG. 10 shows an emission spectrum obtained upon supplying +5V. Light emission having a peak at 460 nm was obtained.

EXAMPLE 21

Figure 11:
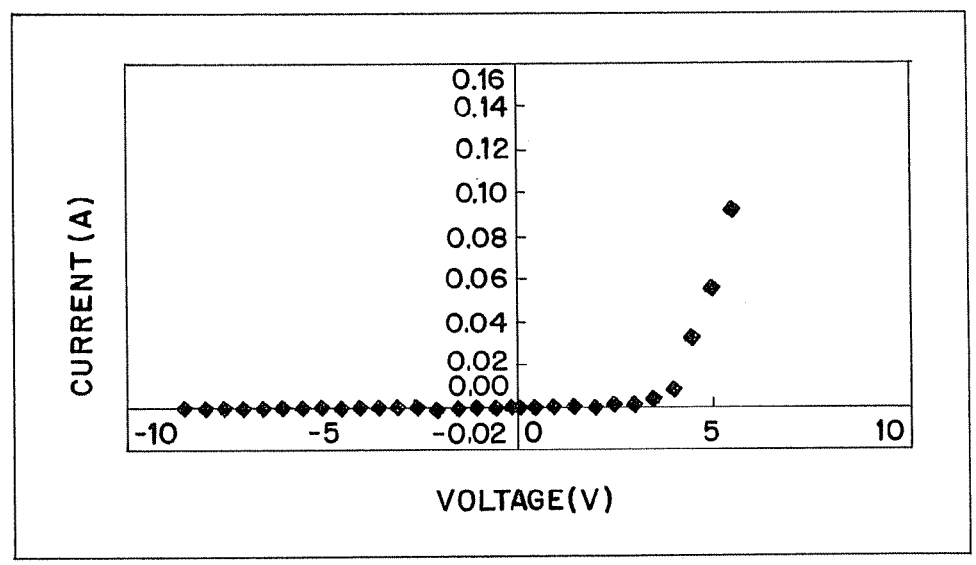
FIG. 11 is a diagram showing a voltage current characteristic of a diode according to Example 21.
Figure 12:
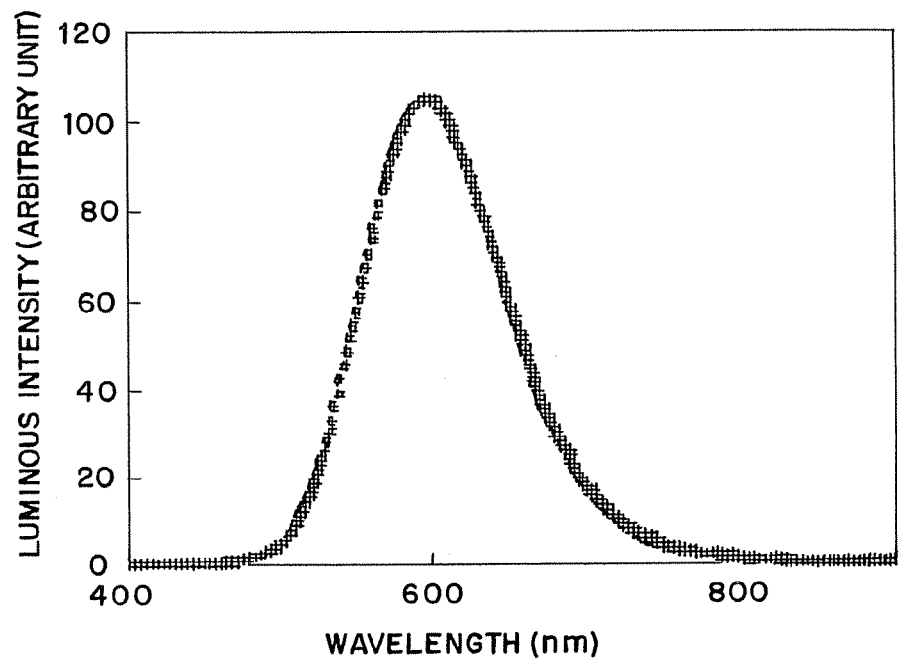
FIG. 12 is a diagram showing an emission spectrum of the diode according to Example 21.

A diode was manufactured like in Example 20 except that a Cu- and Al-doped ZnSe (ZnSe:Cu,Al) layer having a thickness of 100 nm was inserted instead of the non-doped ZnSe layer. The concentration of each of Cu and Al was set to $1 \times 10^{-3}$ atom percent. FIG. 11 shows a current-voltage characteristic curve of this diode. An excellent diode characteristic was obtained. FIG. 12 shows an emission spectrum obtained upon supplying +5V. It was light emission having a peak around 600 nm. Herein, Al added to ZnSe forms a donor level, while Cu added thereto forms an acceptor level. These levels form donor-acceptor pairs and become efficient electron-hole recombination centers to function as efficient light-emitting centers. The light emission confirmed herein is considered such that carriers injected into the ZnSe:Cu,Al layer from both electrodes are captured by the donor-acceptor pairs (Cu,Al ion pairs) and recombined to emit the light.

EXAMPLE 22

A diode was manufactured like in Example 20 except that a PbSe-nanocrystal-dispersed ZnSe layer having a thickness of 100 nm was inserted instead of the non-doped ZnSe layer. The PbSe-nanocrystal-dispersed ZnSe layer was formed in the following manner.

Using an MBE film formation apparatus, molecular beams of components were emitted from a Zn cell and an Se cell while ZnSe-coated PbSe nanocrystals (diameter 4.8 nm, ratio of grain-size standard deviation relative to average grain size (CV value) 3%) dispersed in an organic solvent were emitted as a molecular beam by an electrospray process, so that all three molecular beams were irradiated onto the substrate, thereby forming a ZnSe thin film with PbSe nanocrystals dispersed therein. The volume percent of the PbSe nanocrystals was about 3%.

Figure 13:
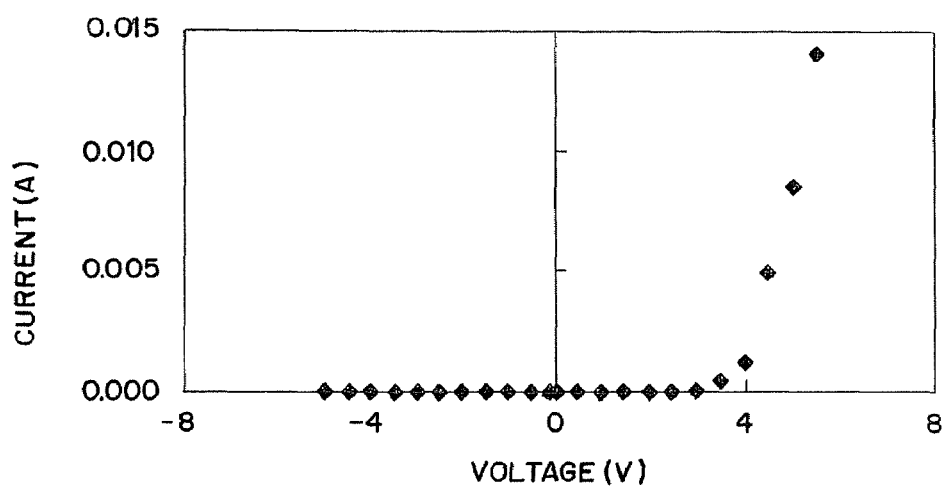
FIG. 13 is a diagram showing a voltage current characteristic of a diode according to Example 22.
Figure 14:
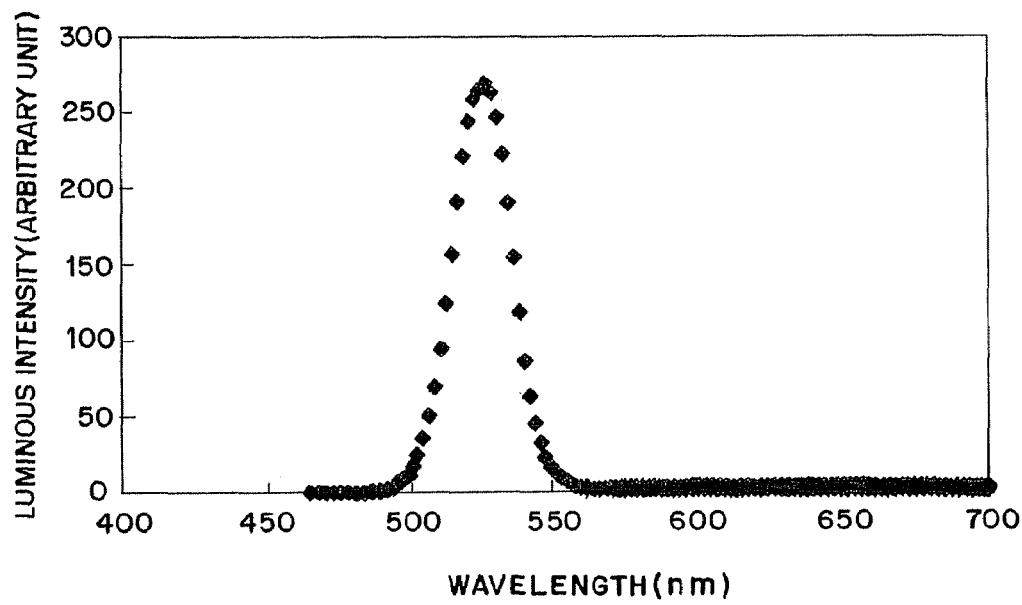
FIG. 14 is a diagram showing an emission spectrum of the diode according to Example 22.

FIG. 13 shows a current-voltage characteristic curve of this diode. An excellent diode characteristic was obtained. FIG. 14 shows an emission spectrum obtained upon supplying +5V. It was light emission having a peak around 525 nm.

The obtained light emission was substantially the same as an emission spectrum of the introduced PbSe nanocrystals. That is, it was found that electron and hole carriers injected from each electrode were captured by the introduced PbSe and recombined together at the PbSe as the light-emitting centers.

EXAMPLE 23

Figure 15:
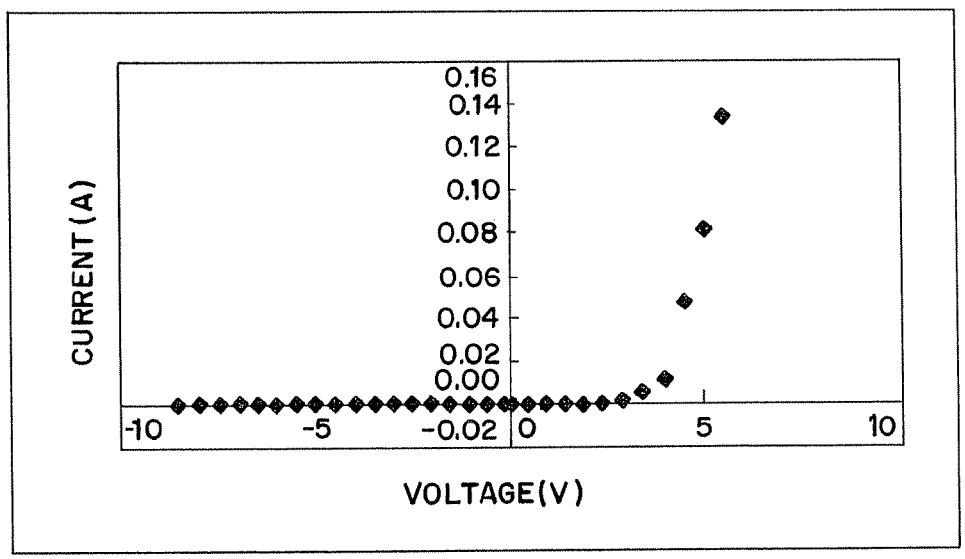
FIG. 15 is a diagram showing a voltage current characteristic of a diode according to Example 23.
Figure 16:
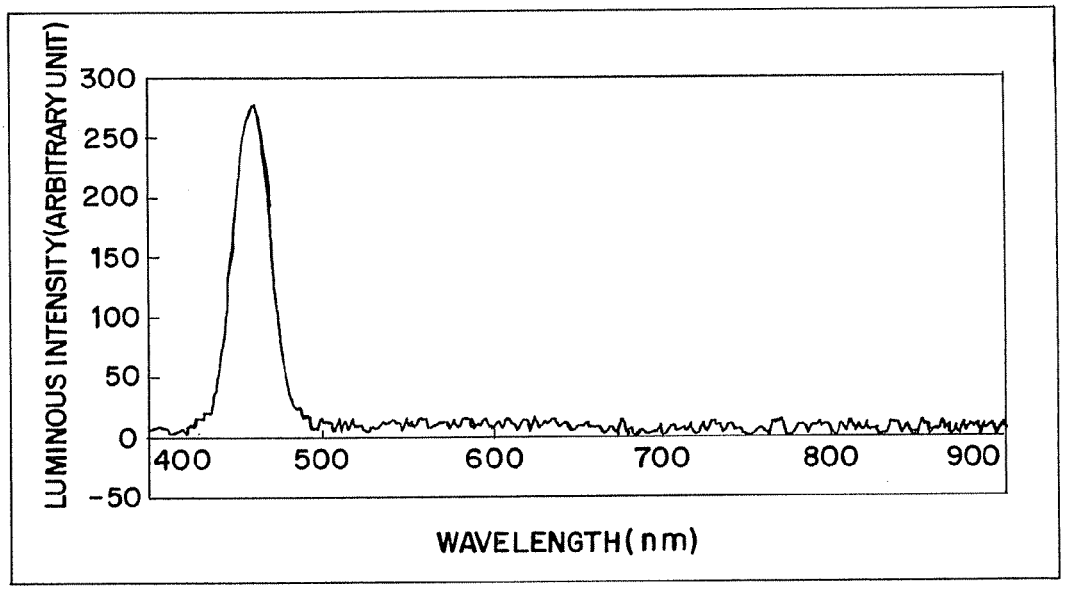
FIG. 16 is a diagram showing an emission spectrum of the diode according to Example 23.

A diode was manufactured like in Example 16 except that the material inserted between the N-doped p-ZnSe and the Al substrate in Example 16 was changed to an alternately deposited film of a Cu—Fe—S material and p-ZnSe. The alternately deposited film of the Cu—Fe—S material and p-ZnSe was formed in the following manner. The Cu—Fe—S material was the same as that produced in Example 1, and the film thicknesses thereof were 0.4 nm, 0.4 nm, 0.6 nm, 0.8 nm, 1.0 nm, 1.2 nm, and 1.4 nm from below. The film thicknesses of ZnSe were each 2 nm. On the top of this alternately deposited film, the foregoing Cu—Fe—S material was formed into a film having a thickness of 1 µm. The film formation was carried out by a resistance heating deposition process using a Mo boat. As shown in FIG. 15, an excellent rectification characteristic was obtained like in Example 16 and, as shown in FIG. 16, with the supply of a voltage equal to or greater than a threshold value, light emission with a peak wavelength of about 465 nm was observed from a p-ZnSe/n-ZnSe interface. In this structure, there are formed crystals such that components of the Cu—Fe—S material are gradually decreased substantially from the surface toward the p-type ZnSe. With such a structure, an inclined composition may be provided to make it function.

In these examples, the film formation of the compound $A_xB_yC_z$ or the solid solution material of $A_xB_yC_z$ and the Group II-VI compound semiconductor was carried out using the resistance heating vacuum deposition process. However, a similar effect can be achieved by another film formation technique, i.e. an electron beam deposition process, an MBE process, or the like. Further, in these examples, $A_xB_yC_z$ or the solid solution material of $A_xB_yC_z$ and the Group II-VI compound semiconductor was used as the feed material of the film formation. However, it is also possible to use, as a feed material, for example, a sulfide such as $Cu_2S$, $FeS_2$, or ZnS, a selenide such as $Cu_2Se$, $FeSe_2$, or ZnSe, or the like. Moreover, it is also possible to use, as a feed material, a simple substance such as Cu, Fe, Zn, S, or Se. It is possible to select and use suitable feed materials in the respective film formation techniques.

EXAMPLE 24

This example is an example wherein an electrode material of the present invention was placed in contact with a p-type Group III-V compound semiconductor.

Using trimethylgallium, trimethylindium, and ammonia as feed materials, Mg-doped p-type InGaN (carrier concentration about $5 \times 10^{18}$ cm$^{-3}$) was grown on a sapphire substrate by a metal organic chemical vapor deposition (MOCVD) process. Electrodes having the shape of FIG. 3 were formed thereon like in Example 16. However, as different from Example 16, the substrate holding temperature was set to 350° C.

Figure 20:
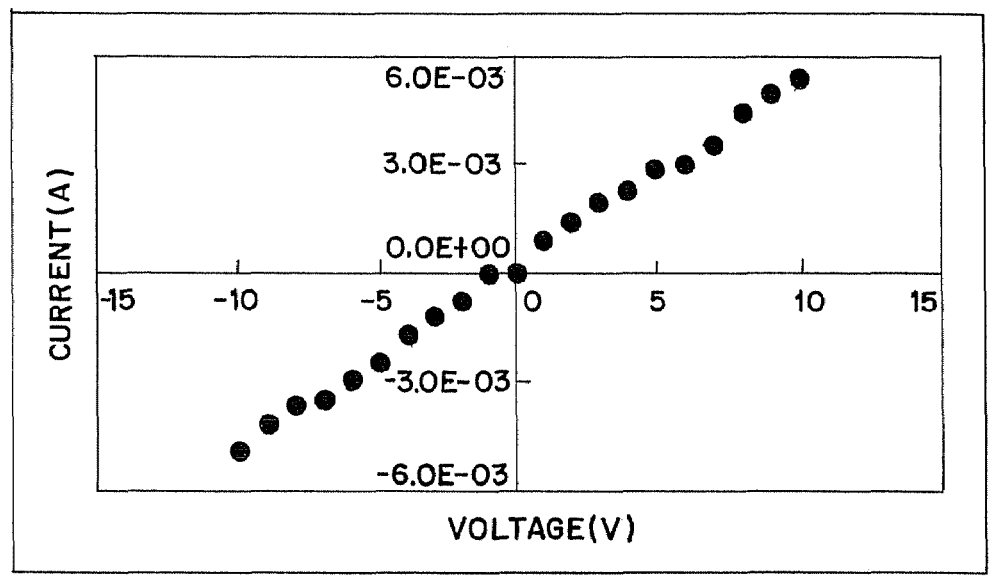
FIG. 20 is a diagram showing a current-voltage characteristic measured using electrodes of Example 24.

FIG. 20 shows a current-voltage characteristic between the electrodes in an obtained semiconductor element. As shown in FIG. 20, a linear characteristic with no threshold voltage was obtained. That is, it was confirmed that the electrode material of the present invention effectively worked also relative to the p-type Group III-V semiconductor.

EXAMPLE 25

In this example, an electrode material of the present invention was used on a glass substrate.

Using high-purity Cu, Fe, and Se (respective purities 5N, 5N, 6N) as feed materials, a Cu—Fe—Se film was formed on the glass by a resistance heating deposition apparatus. The film formation was carried out by keeping the respective feed materials at 1000, 1350, and 150° C. in BN crucibles and simultaneously applying them to the substrate of no-alkali glass (#7059 manufactured by Cornig Corporation) kept at room temperature to thereby deposit a film thereon.

By taking it out from the deposition apparatus and applying thereto post-anneal at 400° C. for 5 minutes in a nitrogen atmosphere, a film having a thickness of 0.45 μm was obtained. It was found from an XRD analysis that the obtained film had a chalcopyrite structure. Further, it was found from an ICP analysis that Cu, Fe, and Se had concentrations of 26, 23, and 51 at %, respectively. In the measurement of Seebeck effect electromotive force, a negative electromotive force (−0.5 mV) was obtained relative to a positive temperature difference (+5° C.) so that it was found to be a p-type semiconductor. The electrical conductivity by a four probe method was 0.012Ωcm.

Also in case of a film with a thickness of 0.42 μm produced in the same manner except that the substrate temperature was kept at 320° C. in the film formation and the post-anneal was not carried out, it was also possible to obtain an excellent low-resistance p-type semiconductor film having a resistivity of 0.008Ωcm. From an ICP analysis, it was found that Cu, Fe, and Se in this film had concentrations of 25, 23, and 52 at %, respectively.

As described above, it was found that the excellently low-resistance p-type semiconductor could be obtained-even by using the substrate made of glass having a random structure with no periodical crystal lattice as opposed to a single crystal. As different from many other semiconductor materials that essentially require epitaxial growth for obtaining practical electrical properties, the degree of freedom for substrate selection is very high, which is the major feature of this material.

EXAMPLE 26

This example is an example wherein an electrode material of the present invention was placed in contact with a p-type organic semiconductor.

On a triphenyldiamine (TPD) film with a thickness of 150 nm formed by a lamp heating vacuum deposition process on a substrate of non-alkali glass (#7059 manufactured by Cornig Corporation), using as a feed material a pellet press-formed of a material synthesized like in Example 1, circular electrodes having a thickness of 100 nm and the shape of FIG. 3 were formed by a pulse laser deposition process (PLD process). On the circular electrodes, Al was deposited into a thickness of about 80 nm by a vacuum deposition process like in Example 16. As a laser light source, use was made of 366 nm-Q switch YAG (about 300 mJ/pulse, beam diameter about 8 mm, 10 Hz, pulse width about 5 nsec). Consequently, there was formed a structure of Al/(Cu, Fe, Se) electrode material/TPD/(Cu, Fe, Se) electrode material/Al between a center electrode and a peripheral electrode.

The substrate holding temperature was set to a room temperature in the film formation of TPD and Al while the substrate holding temperature was set to 50° C. in the film formation of the (Cu, Fe, Se) electrode material. According to an ICP analysis result about another sample produced in the same manner, it was found that this (Cu, Fe, Se) electrode material film has a composition containing Cu, Fe, and Se by 25, 24.5, and 50.5 at %, respectively, which was substantially the same as that of the feed material.

Figure 21:
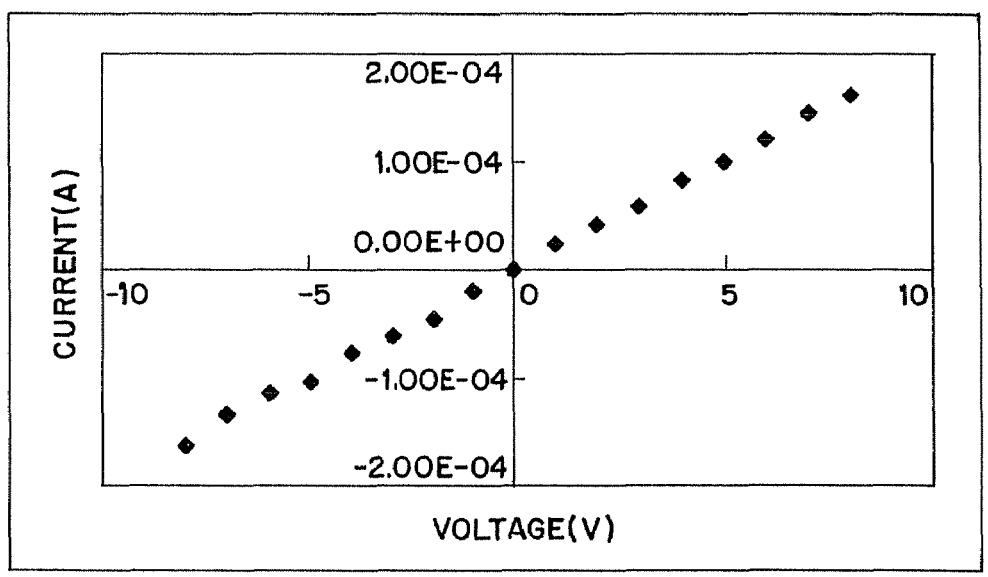
FIG. 21 is a diagram showing a current-voltage characteristic measured using electrodes of Example 26.

A current-voltage characteristic between the electrodes in an obtained semiconductor element is as shown in FIG. 21. A linear characteristic with no threshold voltage was obtained. TPD is one of typical p-type organic semiconductors. That is, it was confirmed that this electrode material effectively worked also relative to the p-type organic semiconductor.

The invention claimed is:

1. A p-type electrode material represented by a composition formula $A_X B_Y C_Z$, characterized in that:
    A consists of at least one element selected from Group 1B metal elements,
    B consists of at least one element selected from Group 8 metal elements, and
    C consists of at least one element selected from S and Se, wherein mole ratios X, Y, and Z are such that $X+Y+Z=1$, $0.20 \leq X \leq 0.35$, $0.17 \leq Y \leq 0.30$, and $0.45 \leq Z \leq 0.55$,
    wherein said A comprises Cu, and said B comprises Fe.

2. A p-type electrode material represented by a composition formula $A_X B_Y C_Z$, characterized in that:
    A consists of at least one element selected from Group 1B metal elements,
    B consists of at least one element selected from Group 8 metal elements, and
    C consists of at least one element selected from S and Se, wherein mole ratios X, Y, and Z are such that $X+Y+Z=1$, $0.20 \leq X \leq 0.35$, $0.17 \leq Y \leq 0.30$, and $0.45 \leq Z \leq 0.55$,
    wherein said p-type electrode material has a chalcopyrite structure.

3. A p-type semiconductor element characterized by having a structure wherein a Group II-VI compound semiconductor and a p-type electrode material are in contact with each other,
    wherein the p-type electrode material is represented by a composition formula $A_X B_Y C_Z$, characterized in that:
    A consists of at least one element selected from Group 1B metal elements,
    B consists of at least one element selected from Group 8 metal elements, and
    C consists of at least one element selected from S and Se,
    wherein mole ratios X, Y, and Z are such that $X+Y+Z=1$, $0.20 \leq X \leq 0.35$, $0.17 \leq Y \leq 0.30$, and $0.45 \leq Z \leq 0.55$.

4. A p-type semiconductor element characterized by comprising:
    a semiconductor having a Group II-VI compound semiconductor layer at at least an outermost surface layer, and a p-type electrode material which is in contact with said semiconductor via said Group II-VI compound semiconductor layer, wherein the p-type electrode material is represented by a composition formula $A_X B_Y C_Z$, characterized in that:

A consists of at least one element selected from Group 1B metal elements,

B consists of at least one element selected from Group 8 metal elements, and

C consists of at least one element selected from S and Se, wherein mole ratios X, Y, and Z are such that $X+Y+Z=1$, $0.20 \leq X \leq 0.35$, $0.17 \leq Y \leq 0.30$, and $0.45 \leq Z \leq 0.55$.

5. A p-type semiconductor element characterized by comprising:

a semiconductor having a Group II-VI compound semiconductor layer at at least an outermost surface layer, and a hole-injection electrode portion placed in contact with said semiconductor via said Group II-VI compound semiconductor layer and made of a solid solution material of a compound $A_X B_Y C_Z$ in the form of a p-type electrode material and a Group II-VI compound semiconductor, wherein the p-type electrode material is represented by a composition formula $A_X B_Y C_Z$, characterized in that:

A consists of at least one element selected from Group 1B metal elements,

B consists of at least one element selected from Group 8 metal elements, and

C consists of at least one element selected from S and Se, wherein mole ratios X, Y, and Z are such that $X+Y+Z=1$, $0.20 \leq X \leq 0.35$, $0.17 \leq Y \leq 0.30$, and $0.45 \leq Z \leq 0.55$.

6. A p-type semiconductor element according to claim 5, characterized in that components of said compound $A_X B_Y C_Z$ in said hole-injection electrode portion decrease continuously or stepwise from the surface toward said Group II-VI compound semiconductor layer.

7. A p-type semiconductor element according to claim 3, characterized in that the Group II-VI compound semiconductor contains at least Zn as a Group II element and at least one element selected from S and Se as a Group VI element.

8. A p-type semiconductor element characterized by having a structure wherein a Group III-V compound semiconductor and an electrode material are in contact with each other, wherein the electrode material is represented by a composition formula $A_X B_Y C_Z$, characterized in that:

A consists of at least one element selected from Group 1B metal elements,

B consists of at least one element selected from Group 8 metal elements, and

C consists of at least one element selected from S and Se, wherein mole ratios X, Y, and Z are such that $X+Y+Z=1$, $0.20 \leq X \leq 0.35$, $0.17 \leq Y \leq 0.30$, and $0.45 \leq Z \leq 0.55$.

9. A p-type semiconductor element characterized by having a structure wherein an organic semiconductor and a p-type electrode material are in contact with each other, wherein the p-type electrode material is represented by a composition formula $A_X B_Y C_Z$, characterized in that:

A consists of at least one element selected from Group 1B metal elements,

B consists of at least one element selected from Group 8 metal elements, and

C consists of at least one element selected from S and Se, wherein mole ratios X, Y, and Z are such that $X+Y+Z=1$, $0.20 \leq X \leq 0.35$, $0.17 \leq Y \leq 0.30$, and $0.45 \leq Z \leq 0.55$.

10. A p-type semiconductor element according to any of claims 4 to 9, characterized in that said p-type semiconductor element is a semiconductor light-emitting element.

11. A p-type electrode material according to claim 1, characterized in that said p-type electrode material has a chalcopyrite structure.

* * * * *